United States Patent
Zhou et al.

(10) Patent No.: US 8,907,833 B1
(45) Date of Patent: Dec. 9, 2014

(54) LOW POWER HIGH SPEED PIPELINE ADC

(71) Applicant: Marvell International Ltd., Hamilton (BM)

(72) Inventors: Hao Zhou, Shanghai (CN); Yonghua Song, Cupertino, CA (US); Tao Shui, San Jose, CA (US); Jie Jiang, Shanghai (CN); Song Chen, Shanghai (CN)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/859,008

(22) Filed: Apr. 9, 2013

Related U.S. Application Data (63) Continuation of application No. 13/109,320, filed on May 17, 2011, now Pat. No. 8,451,160.

(60) Provisional application No. 61/345,444, filed on May 17, 2010.

(51) Int. Cl.
- *H03M 1/38* (2006.01)
- *H03M 1/12* (2006.01)
- *H03M 1/00* (2006.01)

(52) U.S. Cl.
CPC .............. *H03M 1/002* (2013.01); *H03M 1/124* (2013.01)
USPC .......................................... 341/161; 341/155

(58) Field of Classification Search
USPC .......................................... 341/155, 161, 159
See application file for complete search history.

(56) References Cited

U.S. PATENT DOCUMENTS

| | | | |
|---|---|---|---|
| 6,169,504 B1* | 1/2001 | Park ............................... | 341/141 |
| 7,053,804 B1* | 5/2006 | Nairn ............................. | 341/118 |
| 7,277,040 B2 | 10/2007 | Mazhar | |
| 7,551,114 B2 | 6/2009 | Joy et al. | |
| 7,834,786 B2* | 11/2010 | Kawahito et al. ............. | 341/120 |
| 7,999,708 B2 | 8/2011 | Dyer | |
| 8,310,387 B2* | 11/2012 | Harris et al. ................... | 341/155 |
| 8,525,556 B2* | 9/2013 | Singh et al. .................... | 327/94 |

* cited by examiner

*Primary Examiner* — Brian Young (57) ABSTRACT

In accordance with the teachings described herein, systems and methods are provided for a time-interleaved pipeline analog to digital converter. An example pipeline analog to digital converter may include passive sampling circuits and a multiplying digital to analog converter circuit. A first passive sampling circuit includes an input terminal coupled to an analog input signal, and outputs a first sample voltage that is responsive to the analog input signal. A second passive sampling circuit includes an input terminal coupled to the analog input signal, and outputs a second sample voltage that is responsive to the analog input signal. The first and second passive sampling circuits are clocked such that the first sample voltage and the second sample voltage are time-interleaved. A multiplying analog to digital converter (MDAC) circuit receives the time-interleaved first and second sample voltages from the first and second passive sampling circuits and processes the time-interleaved first and second sample voltages to generate a residue output voltage.

18 Claims, 9 Drawing Sheets

LOW POWER HIGH SPEED PIPELINE ADC

CROSS-REFERENCE TO RELATED APPLICATIONS

This application is a continuation of U.S. patent application Ser. No. 13/109,320, filed on May 17, 2011, which claims priority from U.S. Provisional Patent Application No. 61/345,444, filed on May 17, 2010, and entitled "New Low Power High Speed Pipeline ADC," the entirety of which is incorporated herein by reference.

FIELD

The technology described in this patent application relates generally to pipelined analog to digital converters. More particularly, systems and methods are disclosed for a low power high speed pipeline analog to digital converter.

BACKGROUND

High speed analog to digital converters (ADC) are typically used in electronics such as wireless receivers, cameras, modems, HDTV, and ultrasound systems. These electronics utilize sampling rates ranging between 40 MHz and 100 MHz for analog to digital conversion. At these frequencies, pipelined ADCs may provide low power consumption, low noise, and high speed. Pipeline ADCs are often used in applications where dynamic performance is of importance.

An active sample and hold amplifier is used in many configurations because it provides the ADC with a settled input voltage, allowing the subsequent circuit stages to capture the high frequency input signals. In order to achieve low power consumption and low noise while keeping performance high, some configurations remove the active sample and hold amplifier. The active sample and hold amplifier is not a necessity in ADCs and may also add noise and distortion to the analog input signal. In addition, an active sample and hold amplifier may consume large amounts of power and area on the die.

Aperture error in a typical ADC is the error caused by variation in the time at which the ADC transitions from sample mode to hold mode, usually resulting from noise on the clock or input signal. In a pipeline ADC architecture, sampling a continuous time signal, rather than a held signal in an active sample and hold device, may present additional aperture error. With reference to the pipeline ADC system 100 in FIG. 1A, this error results from a bandwidth mismatch of the sub-ADC 102 and the multiplying digital to analog converter (MDAC) 104. The aperture error in a pipeline ADC without active sample and hold can be demonstrated by the following equations.

Figure 1A:
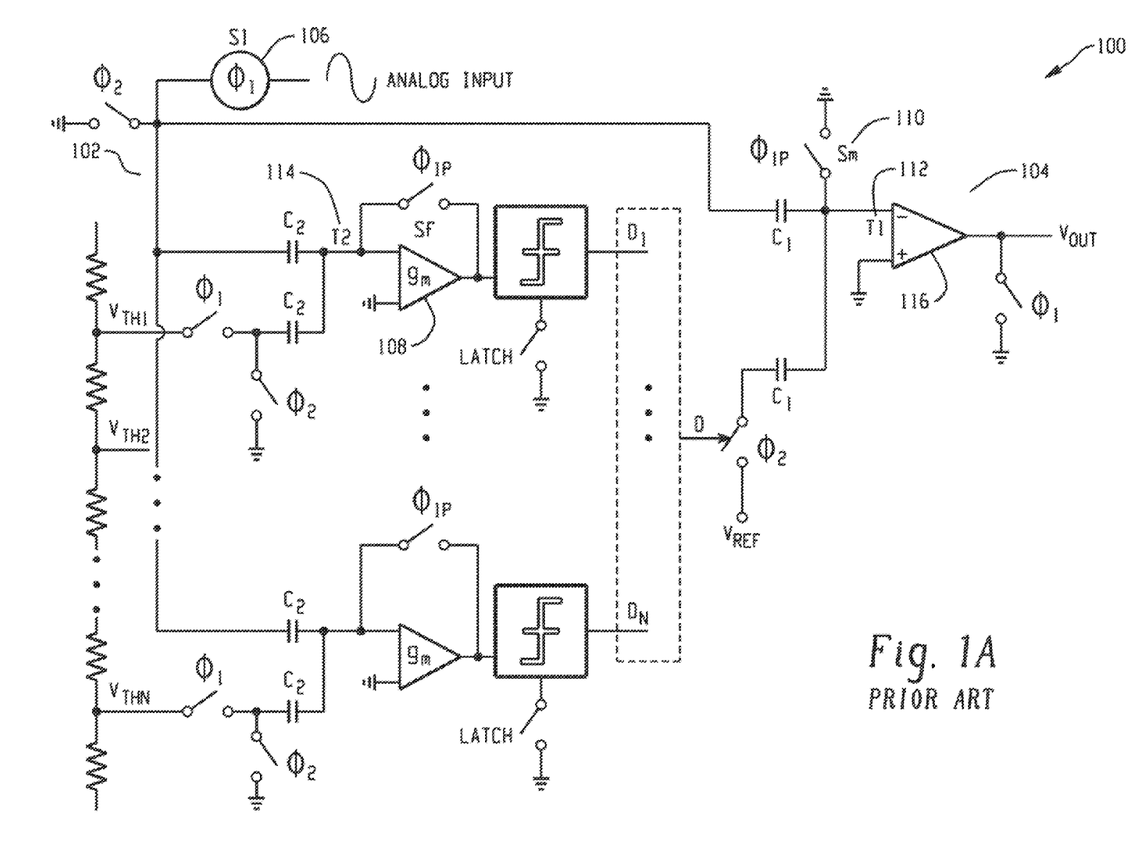
FIGS. 1A and 2A illustrate a typical configuration for a pipeline ADC system.

Assuming a full-scale sine wave at the input:

$$V_{in} = V_{REF} \times \sin(2\pi f_{in} t)$$

The maximum slope of the signal is represented by:

$$\left. \frac{dV_{in}}{dt} \right|_{Max} = V_{REF} \times 2\pi f_{in}$$

If the time constant mismatch between the sub-ADC 102 and the MDAC 104 is $\Delta \tau = \epsilon \times \tau$, then the maximum aperture error may be represented by:

$$V_{error}|_{Max} = V_{REF} \times 2\pi f_{in} \times \epsilon \times \tau$$

For the 2.5 bit first stage, the error should be smaller than the correction range, that is $V_{error}|_{Max} < 1/8 V_{REF}$. In addition, the maximum input frequency $f_{in}$ of the input sampling networks of sub-ADC 102 and MDAC 104 should be less than or equal to $$\frac{0.1}{\tau}.$$

The time constant error may then be represented by:

$$\epsilon|_{Max} < \frac{1}{2\pi \times 0.1 \times 8} = 0.2$$

Because the aperture error grows rapidly with respect to the input frequency, FIG. 1A utilizes a sampling switch 106. The sampling switch 106 is shared by both the sub-ADC 102 and the MDAC 104. Because the switch is shared, the aperture error can be reduced by matching the time constant of the sampling networks with the following equations:

$$\frac{2C_1 + C_{p1}}{2C_2 + C_{p2}} = \frac{1/g_m}{R_{sm}};$$

$$R_{sm} = \frac{1}{u_n C_{ox} \frac{W}{L} (V_{gs} - V_{TH})_{sm}}; \text{ and}$$

$$g_m = u_n C_{ox} \frac{W}{L} (V_{gs} - V_{TH}) \text{ preamp}.$$

In the above equations, $g_m$ is the transconductance of the preamplifier 108, $R_{Sm}$ is the on-resistance of the MDAC switch 110, and $C_{p1}$ and $C_{p2}$ are the total parasitic capacitance at nodes T1 112 and T2 114. To optimize the time constant mismatch, the ratio of $1/g_m$ to $R_{Sm}$ should be set to 1. This approach, however, provides for increased power consumption by the preamplifiers 108.

Figure 1B:
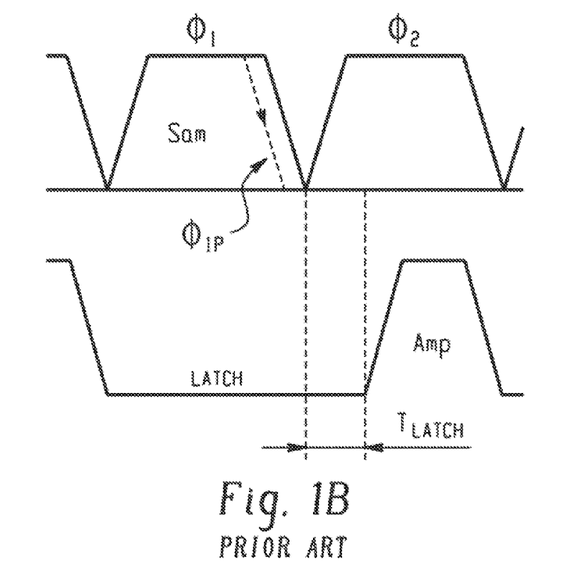
FIGS. 1B and 2B are timing diagrams corresponding to FIGS. 1A and 2A, respectively.

As shown in FIG. 1B, the time window for $T_{LATCH}$ reduces the net amplification duration of MDAC 116. This scenario requires the operational transconductance amplifier of the MDAC 116 to consume twice the amount of power as compared to a traditional structure. Because the sampling duration is made shorter than the normal 50% duty cycle, the preamplifiers 108 must also be faster to complete their operations during $T_{LATCH}$. The faster operation causes the preamplifiers to consume more power.

Figure 2A:
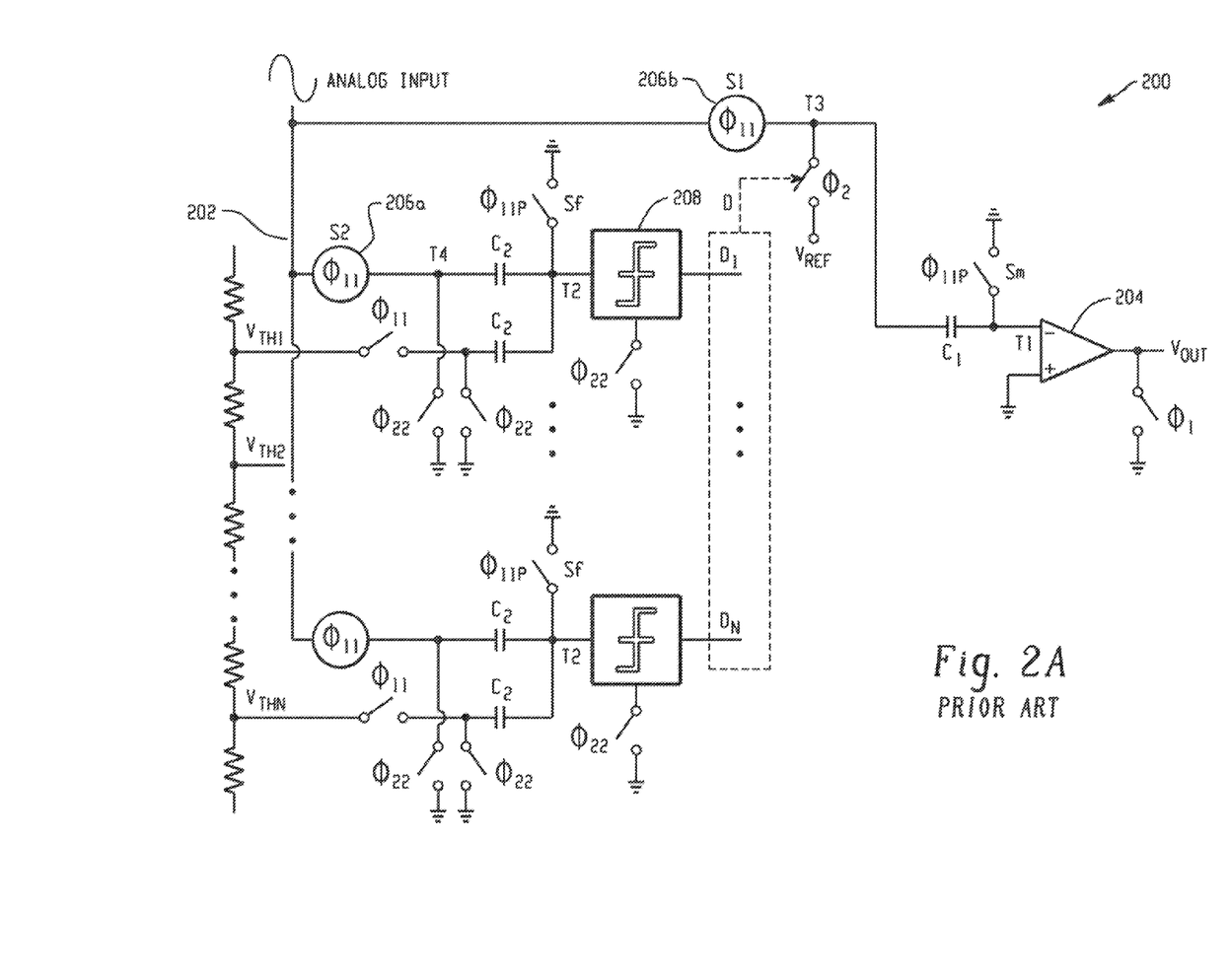
Figure 2B:
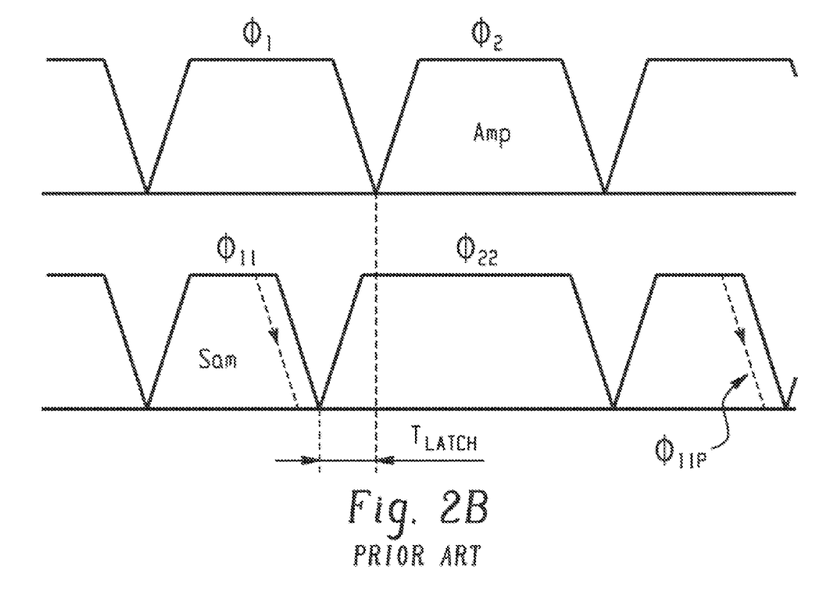

A typical approach to reducing the power consumption of the pipeline ADC circuit of FIG. 1A is shown in FIG. 2A. Compared with the system 100 in FIG. 1A, the pipeline ADC system 200 of FIG. 2A provides each flash comparator 202 and the MDAC 204 with their own input sampling switches 206a and 206b, respectively. Using separate sampling switches provides for no kickback from the latches 208 to the MDAC 204. Accordingly, each flash comparator 202 does not require a preamplifier and can only include a latch 208. Because there are no preamplifiers in the flash comparators 202, the sampling duration is shortened as compared to the typical 50% duty cycle, as shown in FIG. 2B. In contrast to FIG. 1A, however, there are no preamplifiers to consume power, so there is no power tradeoff at the MDAC 204.

Even though there is reduced power consumption in the system 200 of FIG. 2A as compared to the system 100 in FIG. 1A, the lack of preamplifiers in the flash comparators 202 creates a larger than normal input-inferred offset in each of the flash comparators 202. The large offset may occupy a significant portion of the digital correction range and leave only a small window for the aperture error correction.

SUMMARY

In accordance with the teachings described herein, systems and methods are provided for a time-interleaved pipeline analog to digital converter. An example of a pipeline analog to digital converter may include passive sampling circuits and a multiplying digital to analog converter circuit. A first passive sampling circuit includes an input terminal coupled to an analog input signal, and outputs a first sample voltage that is responsive to the analog input signal. A second passive sampling circuit includes an input terminal coupled to the analog input signal, and outputs a second sample voltage that is responsive to the analog input signal. The first and second passive sampling circuits are clocked such that the first sample voltage and the second sample voltage are time-interleaved. A multiplying analog to digital converter (MDAC) circuit receives the time-interleaved first and second sample voltages from the first and second passive sampling circuits and processes the time-interleaved first and second sample voltages to generate a residue output voltage.

The first and second passive sampling circuits may each further include a flash analog to digital converter (ADC) circuit coupled to a first decoder. The MDAC may further comprise a first hold capacitor coupled to the output of the first passive sampling circuit and a second hold capacitor coupled to the output of the second passive sampling circuit. The MDAC input is coupled to the output terminal of the first and second hold capacitors.

The first passive sampling circuit receives the analog input voltage when a first sample clock signal is in a logic high state and the second passive sampling circuit receives the analog input voltage when a second sample clock signal is in a logic high state. The MDAC receives the first sample voltage when a first hold clock signal is in a logic high state and the MDAC receives the second sample voltage when a second hold clock signal is in a logic high state.

The first sample clock signal is in a logic high state at every other logic high state of the first input clock signal and the second sample clock signal is in a logic high state at every other logic high state of the first input clock signal, such that at each logic high state of the first input clock signal, only one of the first or second sample clock signals is in a logic high state.

The first hold clock signal is in a logic high state at every other logic high state of the second input clock signal and the second hold clock signal is in a logic high state at every other logic high state of the second input clock signal, such that at each logic high state of the second input clock signal, only one of the first or second hold clock signals is in a logic high state.

An example of a method for processing an analog input signal in a pipelined converter includes receiving the analog input signal at a first passive sampling circuit and outputting a first sample voltage that is responsive to the analog input signal; receiving the analog input signal at a second passive sampling circuit and outputting a second sample voltage that is responsive to the analog input signal; time-interleaving the first and second sample voltages; and receiving, at a multiplying analog to digital converter (MDAC), the time-interleaved first and second sample voltage from the first and second passive sampling circuits and processing the time-interleaved first and second sample voltages to generate a residue output voltage.

A second example of a method for processing an analog signal input in a pipelined converter, includes receiving, at a first passive sampling circuit, an input voltage when a first sample clock signal is in a logic high state, the first sample clock signal being in a logic high state at every other logic high state of a first input clock signal; receiving, at a second passive sampling circuit, an input voltage when a second sample clock signal is in a logic high state, the second sample clock signal being in a logic high state at every other logic high state of the first input clock signal, such that at each high logic state of the first input clock signal, only one of the first or second sample clock signals is in a logic high state; outputting a sampled voltage, by the first passive sampling circuit, to a multiplying digital to analog converter (MDAC) when a first hold clock signal is in a logic high state, the first hold clock signal being in a logic high state at every other logic high state of a second input clock signal; and outputting a sampled voltage, by the second passive sampling circuit, to the MDAC when a second hold clock signal is in a logic high state, the second hold clock signal being in a logic high state at every other logic high state of the second input clock signal, such that at each high logic state of the second input clock signal, only one of the first or second hold clock signals is in a logic high state.

DETAILED DESCRIPTION

Figure 3:
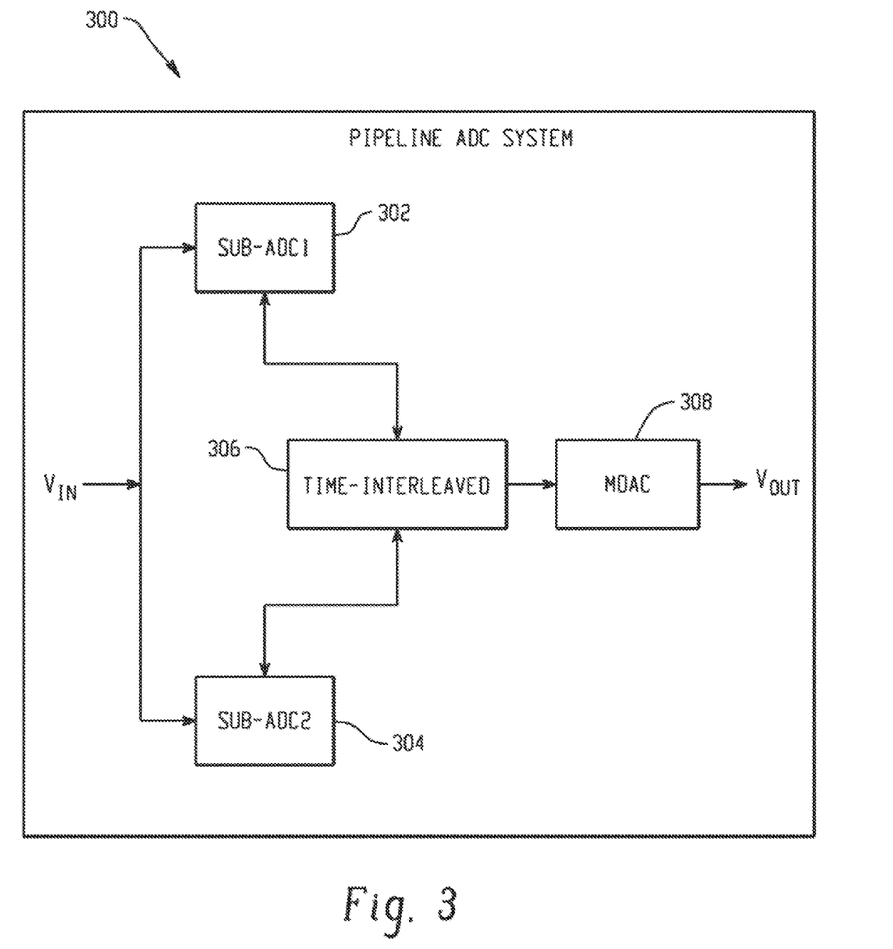
FIG. 3 is an example of a time-interleaved pipeline ADC system with high speed capabilities and low power consumption.

FIG. 3 is a block diagram of an example of a time-interleaved pipeline ADC system 300 with high speed capabilities and low power consumption. The pipeline ADC system 300 includes Sub-ADC1 302, Sub-ADC2 304, a time-interleaved module 306, and a MDAC 308. In operation, the pipeline ADC system receives an analog input signal $V_{IN}$ at both Sub-ADC1 302 and Sub-ADC2 304. The Sub-ADCs 302 and 304 perform sampling operations on the analog input signal $V_{IN}$ and generate a processed signal. The time-interleaved module 306 controls the timing of the Sub-ADCs so that they operate in a time-interleaved manner. The time-interleaved module may be implemented, for example, in a microprocessor or a clocking circuit. The Sub-ADCs 302 and 304 operate in a time-interleaved manner so that the MDAC 308 receives the processed signals output from each Sub-ADC in an alternating fashion.

The alternating, time-interleaved, pipeline ADC system 300 allows the Sub-ADCs 302 and 304 extra time to complete the sampling operations. Because of this extra time, the sub-ADCs 302 and 304 run with reduced current, and thus, consume less power. The extra time also allows the sub-ADCS 302 and 304 to more accurately capture and process the entire signal and negates the effects of any delay caused by the preamplifiers to the signal processing operation.

The sub-ADCs 302 and 304 and the MDAC 308 each utilize a separate sampling switch and capacitors. This allows for the aperture to be greatly reduced because the time constants of each circuit may be matched with the following formula:

$$\frac{2C_1 + C_{p1}}{2C_2 + C_{p2}} = \frac{1/g_m}{R_{sm}}$$

Because the time constants may be matched and the time for the flash comparators to sample the input voltage is lengthened, the time-interleaved pipeline ADC system 300 can operate with low power consumption and nominal offset.

Figure 4A:
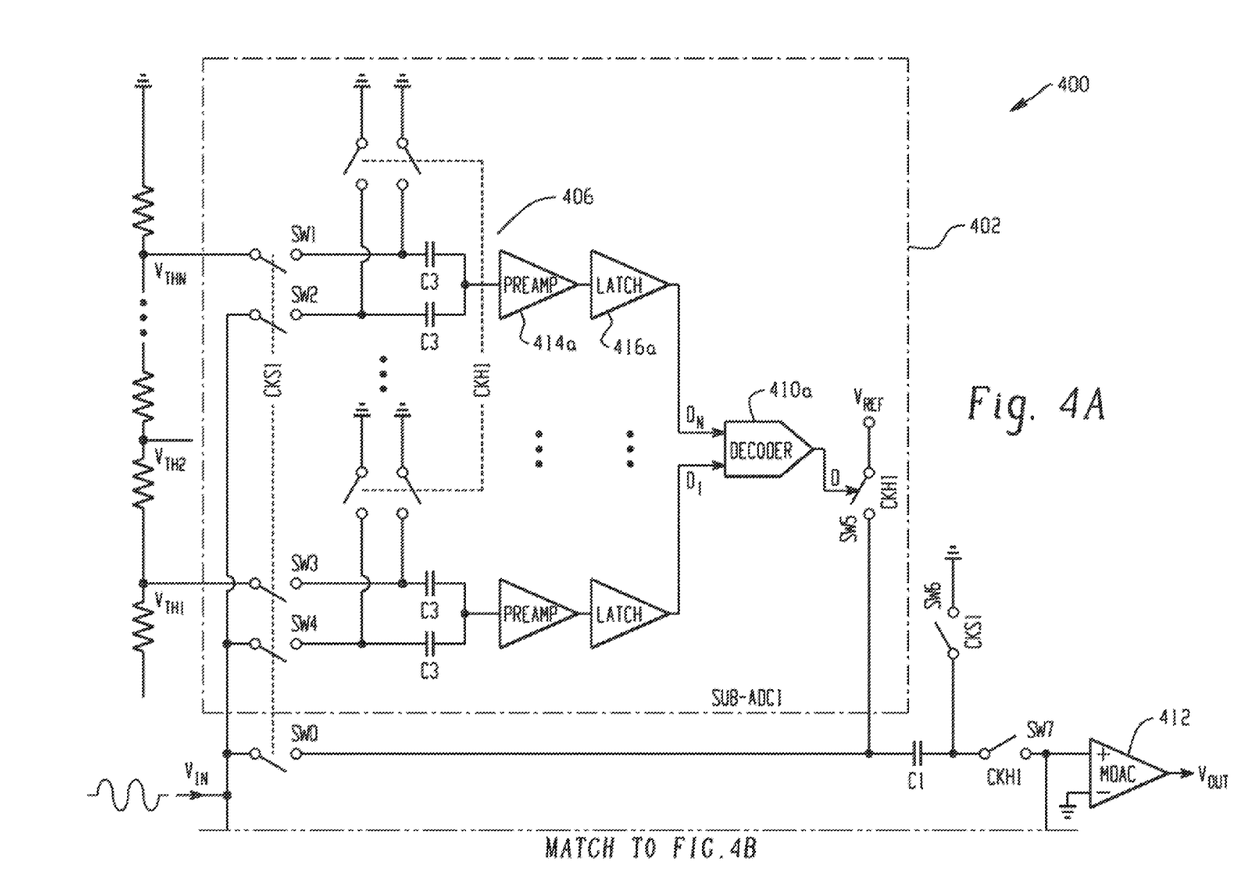
FIGS. 4A and 4B are a circuit diagram for a time-interleaved pipeline ADC system.
Figure 4B:
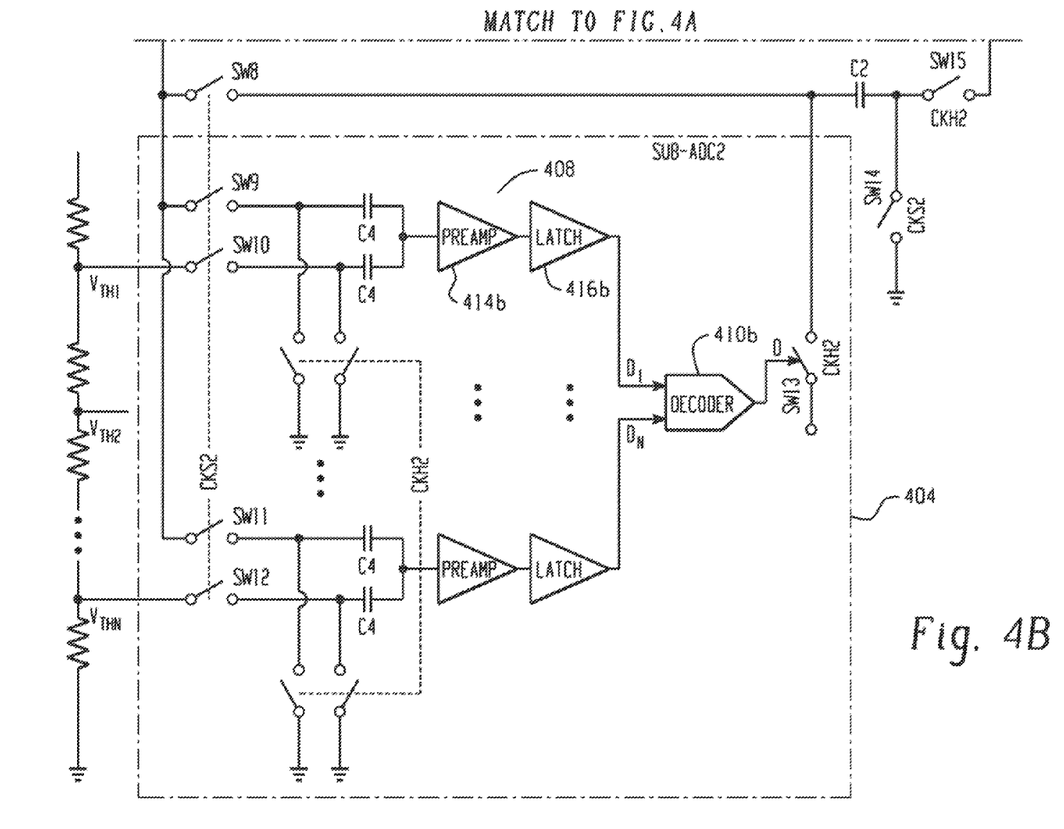

FIGS. 4A and 4B provide a more detailed example of the time-interleaved pipeline ADC system of FIG. 3. The pipeline ADC system 400 of FIGS. 4A-B includes Sub-ADC1 402, Sub-ADC2 404, flash comparators 406 and 408, decoders 410, and a MDAC 412. In operation, the pipeline ADC system 400 processes an input analog voltage $V_{IN}$ based on the clock signals illustrated in FIG. 5. Therefore, the operation of the pipeline ADC system 400 will be described with reference to FIGS. 4A, 4B, and 5.

The input analog voltage $V_{IN}$ is received at both Sub-ADC1 402 and Sub-ADC2 404. When clock signal CKS1 goes high 502 (FIG. 5), switches SW0-SW4 close, allowing the input analog voltage $V_{IN}$ to be received at the flash comparators 406 in Sub-ADC1 402. As shown in FIGS. 4A-B, Sub-ADCs 402 and 404 may comprise a plurality of flash comparators 406 and 408, depending on the bit size being sampled. The input analog voltage $V_{IN}$ is subsequently sampled across capacitors C3 before entering the preamplifier 414 and latch 416 for digitization. The digitized output voltage from the latch in Sub-ADC1 402 is not received by the MDAC 412, however, until clock signal CKH1 goes high 504.

Figure 5:
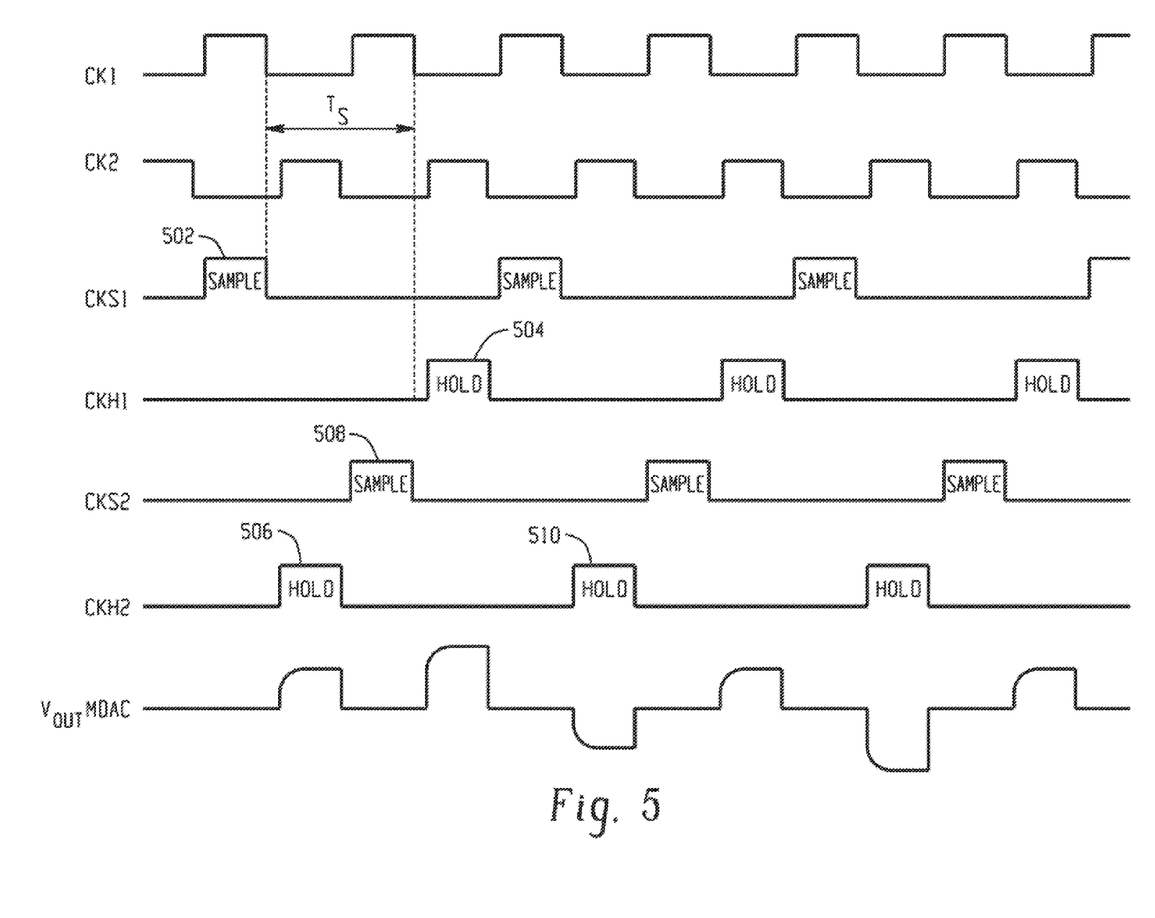
FIG. 5 illustrates clock signals for a time-interleaved pipeline ADC system.

As shown in FIG. 5, clock signal CKH1 does not go high until a time period $T_S$ had elapsed. The time period $T_S$ represents the time interval for the preamplifier 414 and latch 416 to process the analog input voltage $V_{IN}$. Therefore, the digitized output voltage is output from the latch prior to clock signal CKH1 transitioning to a high state. This digitized output voltage may be output to another stage of the pipeline ADC, such as a digital error correction stage, so that the digital output may be utilized in an electronic device.

When clock signal CKH1 goes high 504, switches SW5 and SW7 close and switch SW6 opens, allowing the digitized output voltage to also be received at the MDAC 412 after passing through hold capacitor C1.

Because the pipeline ADC system 400 operates the Sub-ADCs 402 and 404 in a time-interleaved manner, Sub-ADC1 402 and Sub-ADC2 404 output a digitized voltage at alternating intervals. As illustrated in FIG. 5, each Sub-ADC 402 and 404 outputs a digitized voltage during a $T_S$ time period.

Following the time period TS, the Sub-ADCs 402 and 404 process the digitized signal in the MDAC 412.

Sub-ADC2 404 operates in a similar manner as Sub-ADC1 402. As shown in FIG. 5, when Sub-ADC1 402 is performing its digitization of the input analog signal $V_{IN}$ during the time period $T_S$, clock signal CKH2 506 goes high. At this moment, any output from the Sub-ADC2 404 may be input to the MDAC 412 and clock signal CKS2 508 is low so that the input analog voltage $V_{IN}$ is not input to the flash comparators 408. Following the high state of CKH2 506, clock signal CKS2 508 goes high. At this moment, switches SW8-12 close, allowing the input analog voltage $V_{IN}$ to be received at the flash comparators 408 in Sub-ADC2 404. The input analog voltage $V_{IN}$ is subsequently sampled across capacitors C4 before entering the preamplifier 414b and latch 416b for digitization. The digitized output voltage from the latch in Sub-ADC2 404 is not received by the MDAC 412, however, until clock signal CKH2 goes high 510.

As shown in FIG. 5, clock signal CKH2 does not go high at 510 until a second time period ($2*T_S$) has elapsed. Just as in Sub-ADC1 402, a digitized output voltage in Sub-ADC2 404 is output from the latch 410b prior to clock signal CKH2 transitioning to a high state 510. When clock signal CKH2 goes high 510, switches SW13 and SW15 close and switch SW14 opens, allowing the digitized output voltage to be received at the MDAC 412 after passing through hold capacitor C2.

The MDAC 412 processes the digitized output voltage during each hold interval of the system—when clock signal CKH1 or CKH2 are in a high state. The MDAC 112 then outputs analog output voltage $V_{OUT}$, as illustrated in FIG. 5. The output analog voltage, or residue, $V_{OUT}$ may subsequently be received by a next stage configured to process the residue voltage. This time-interleaved process may repeat as long as necessary to process each subsequent sample.

Moving the preamp and latch time from $T_{LATCH}$ in FIG. 2B to $T_S$ in FIG. 5 is an advantage of passive time-interleaved sampling. $T_S$ may be much longer than $T_{LATCH}$, allowing for much less power to be consumed by the preamp and latch. In addition, because the preamp and latch time is moved, no $T_{LATCH}$ is needed and the net amplification duration of the MDAC may be extended to near half of $T_S$, allowing for less power consumption by the MDAC.

Figure 6:
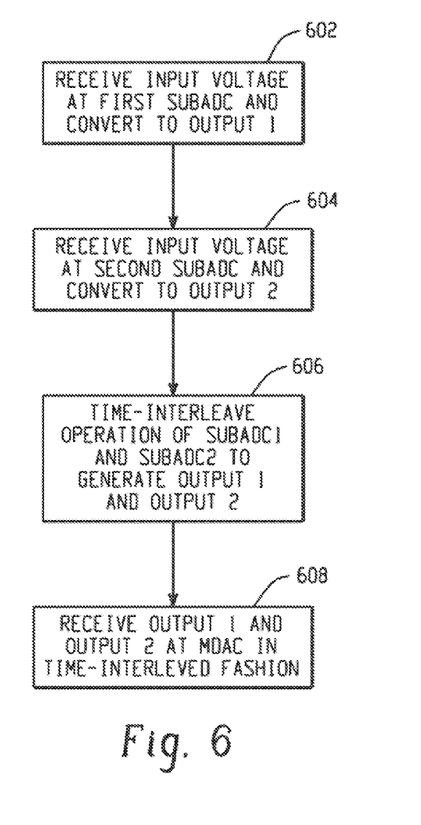
FIG. 6 is a flow diagram illustrating a method of time-interleaving sub-analog-to-digital converters in a pipeline ADC system.

FIG. 6 is a flow diagram illustrating an example of a method of time-interleaving sub-analog-to-digital converters in a pipeline ADC system. At 602 a first sub-ADC receives an input analog voltage signal and converts the input analog voltage signal to an output digital voltage signal. Similarly, at 604, a second sub-ADC receives the input analog voltage signal and converts the input analog voltage signal to a second output digital voltage signal. At 606, the sub-ADCs are operated in a time-interleaved, or ping-pong, fashion. The time-interleaved operation of the sub-ADCs produces the output digital voltage signals at alternating time intervals. Therefore, at step 608, the output digital voltage signals are received, for example by a MDAC, in a time-interleaved fashion.

Figure 7:
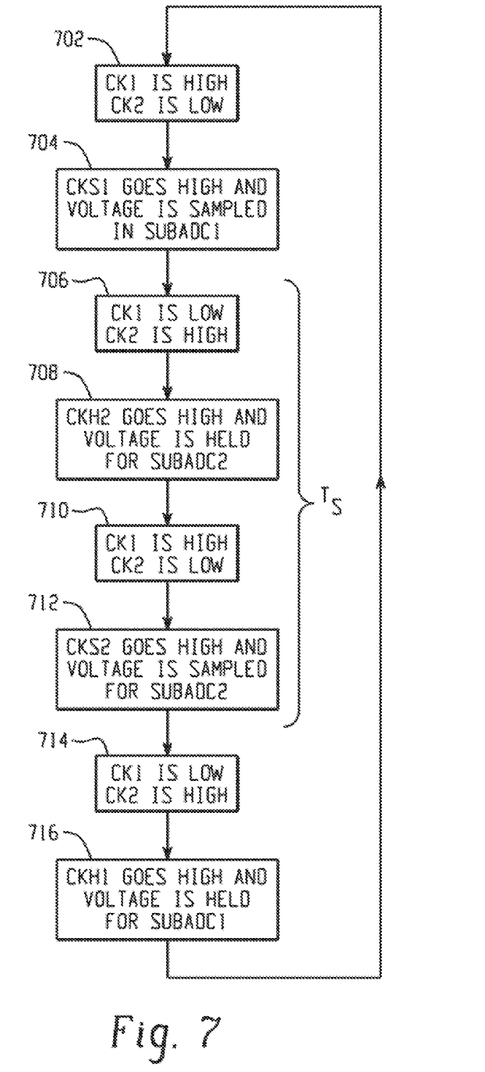
FIG. 7 is a flow diagram illustrating operation of time-interleaving sub-analog-to-digital converters in a pipeline ADC system.

FIG. 7 is a flow diagram illustrating the operation of clock signals for a method of time-interleaving sub-analog-to-digital converters in a pipeline ADC system, such as the method shown in FIG. 6. At 702, clock signal CK1 is high and clock signal CK2 is low (see, e.g., CK1 and CK2 in FIGS. 4 and 5). For this condition, at 704, clock signal CKS1 goes high and an input analog voltage is sampled in sub-ADC1. After 704, the time period $T_S$ begins. During this time period, the input analog voltage signal is digitized. Also during this time period, at 706, clock signal CK1 goes low and clock signal CK2 goes high. During this condition, clock signal CKH2 also goes high and an output digitized voltage from sub-ADC2 is held at 708. At 710, clock signal CK1 returns to a high state and clock signal CK2 returns to a low state. At 712, clock signal CKS2 goes high and the input analog voltage is sampled at sub-ADC2. Following 712 is also the end of the $T_S$ time period. At 714, clock signal CK1 enters the low state and clock signal CK2 enters the high state. Subsequently, at 716, clock signal CKH2 goes high and the digitized output voltage produced during the time period $T_S$ is held for sub-ADC1. The process then returns at 702 and processes the next sample bits for the system.

Figure 8:
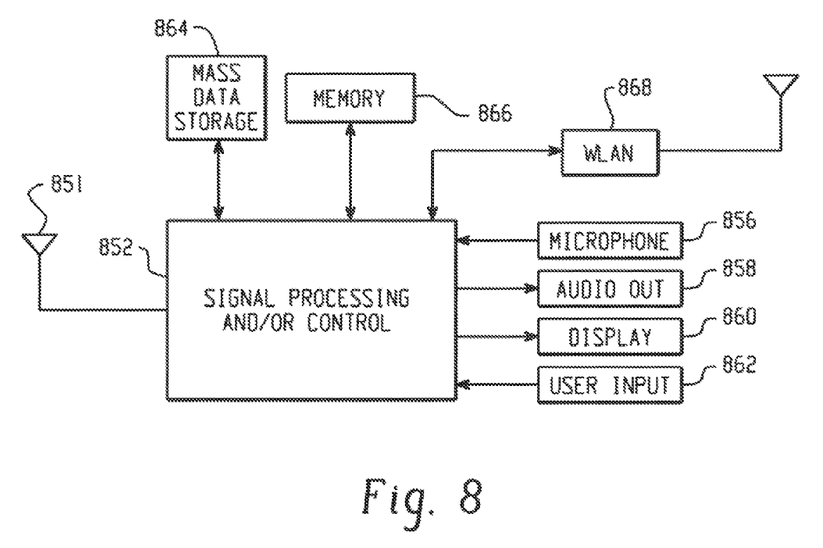
FIG. 8 is an example of a system that may utilize a time-interleaved pipeline ADC.

FIG. 8 illustrates an example of a system that may utilize a time-interleaved pipeline ADC. As shown in FIG. 8, a system utilizing a time-interleaved pipeline ADC may include a signal processing and/or control circuit 852, such as a microprocessor or DSP, a plurality of input/output devices 856, 858, 860, 862, a memory 866, a mass data storage 864, and/or wireless communication circuitry 851, 868. In different embodiments, the system illustrated in FIG. 8 may be included (in whole or in part) in a cellular telephone, a computer, a DVD player, a television, a set-top box, a vehicle, a digital media player and/or other suitable systems or devices.

This written description uses examples to disclose the invention, include the best mode, and also to enable a person skilled in the art to make and use the invention. The patentable scope of the invention may include other examples that occur to those skilled in the art. For instance, although the example time-interleaved pipeline ADC systems described herein include two Sub-ADCs, other examples may include more than two Sub-ADCs.

What is claimed is:

1. An electronic device comprising:
   a first sampling circuit configured to, on a repeating basis,
      sample an input voltage from an input terminal,
      generate, from the input voltage, a first output signal, and
      output, on an output line, the first output signal as a first pulse; and
   a second sampling circuit configured to, on a repeating basis,
      sample an input voltage from the input terminal,
      generate, from the input voltage, a second output signal, and
      output, on the output line, the second output signal as a second pulse;
   wherein the sampling by the first sampling circuit is time-interleaved with the sampling by the second sampling circuit;
   wherein the first pulses are time-interleaved with the second pulses; and
   wherein the first output signal is latched by the first sampling circuit when output, and wherein the second output signal is latched by the second sampling circuit when output.

2. An electronic device comprising:
   a first sampling circuit configured to, on a repeating basis,
      sample an input voltage from an input terminal,
      generate, from the input voltage, a first output signal, and
      output, on an output line, the first output signal as a first pulse; and
   a second sampling circuit configured to, on a repeating basis,
      sample an input voltage from the input terminal,
      generate, from the input voltage, a second output signal, and
      output, on the output line, the second output signal as a second pulse;
   wherein the sampling by the first sampling circuit is time-interleaved with the sampling by the second sampling circuit; and
   wherein the first pulses are time-interleaved with the second pulses;
   wherein the first sampling circuit and the second sampling circuit are timed to yield a repeating time sequence of (i) sampling by the first sampling circuit, (ii) outputting by the second sampling circuit, (iii) sampling by the second sampling circuit, and (iv) outputting by the first sampling circuit.

3. The electronic device of claim 1 wherein the first pulses do not overlap the second pulses.

4. The electronic device of claim 1 wherein the first sampling circuit generates the first output signal from the input voltage in substantially the same manner as the second sampling circuit generates the second output signal from the input voltage.

5. An electronic device comprising:
   a first sampling circuit configured to, on a repeating basis,
      sample an input voltage from an input terminal,
      generate, from the input voltage, a first output signal, and
      output, on an output line, the first output signal as a first pulse; and
   a second sampling circuit configured to, on a repeating basis,
      sample an input voltage from the input terminal,
      generate, from the input voltage, a second output signal, and
      output, on the output line, the second output signal as a second pulse;
   a third sampling circuit configured to, on a repeating basis,
      sample an input voltage from the input terminal,
      generate, from the input voltage, a third output signal, and
      output, on the output line, the third output signal as a third pulse;
   wherein the sampling by the first sampling circuit, the sampling by the second sampling circuit and the sampling by the third sampling circuit are time-interleaved; and
   wherein the first pulses, the second pulses and the third pulses are time-interleaved.

6. An electronic device comprising:
   a first sampling circuit configured to, on a repeating basis,
      sample an input voltage from an input terminal,
      generate, from the input voltage, a first output signal, and
      output, on an output line, the first output signal as a first pulse; and
   a second sampling circuit configured to, on a repeating basis,
      sample an input voltage from the input terminal,
      generate, from the input voltage, a second output signal, and
      output, on the output line, the second output signal as a second pulse;
   wherein the sampling by the first sampling circuit is time-interleaved with the sampling by the second sampling circuit;
   wherein the first pulses are time-interleaved with the second pulses; and wherein the sampling circuits are flash analog-to-digital converters, and wherein the first output signal and the second output signal are digital output signals indicative of the input voltage.

7. The electronic device of claim 6 further comprising a digital-to-analog converter configured to convert each of the digital output signals into an output analog voltage.

8. The electronic device of claim 1 further comprising:
a sample-timing clock configured to output a series of first sample-timing pulses interleaved with a series of second sample-timing pulses;
wherein each first sample-timing pulse activates the sampling by the first sampling circuit; and
wherein each second sample-timing pulse activates the sampling by the second sampling circuit.

9. The electronic device of claim 8 further comprising:
an output-timing clock configured to output a series of first output-timing pulses interleaved with a series of second output-timing pulses;
wherein the output-timing pulses are interleaved with the sample-timing pulses;
wherein the outputting by the first sampling circuit occurs during each first output-timing pulse; and
wherein the outputting by the second sampling circuit occurs during each second output-timing pulse.

10. A method comprising:
performing repeatedly, by a first sampling circuit,
sampling an input voltage from the input terminal,
generating, from the input voltage, a first output signal, and
outputting, on an output line, the first output signal as a first pulse; and
performing repeatedly, by a second sampling circuit,
sampling an input voltage from the input terminal,
generating, from the input voltage, a second output signal, and
outputting, on the output line, the second output signal as a second pulse;
wherein the sampling by the first sampling circuit is time-interleaved with the sampling by the second sampling circuit;
wherein the first pulses are time-interleaved with the second pulses on the output line; and
wherein the first output signal is latched by the first sampling circuit when output, and wherein the second output signal is latched by the second sampling circuit when output.

11. A method comprising:
performing repeatedly, by a first sampling circuit,
sampling an input voltage from the input terminal,
generating, from the input voltage, a first output signal, and
outputting, on an output line, the first output signal as a first pulse; and
performing repeatedly, by a second sampling circuit,
sampling an input voltage from the input terminal,
generating, from the input voltage, a second output signal, and
outputting, on the output line, the second output signal as a second pulse;
wherein the sampling by the first sampling circuit is time-interleaved with the sampling by the second sampling circuit;
wherein the first pulses are time-interleaved with the second pulses on the output line; and
wherein the first sampling circuit and the second sampling circuit are timed to yield a repeating time sequence of (i) sampling by the first sampling circuit, (ii) outputting by the second sampling circuit, (iii) sampling by the second sampling circuit, and (iv) outputting by the first sampling circuit.

12. The method of claim 10 wherein the first pulses do not overlap the second pulses.

13. The method of claim 10 wherein the first sampling circuit generates the first output signal from the input voltage in substantially the same manner as the second sampling circuit generates the second output signal from the input voltage.

14. The method of claim 10 comprising:
performing repeatedly, by a third sampling circuit,
sample an input voltage from the input terminal,
generate, from the input voltage, a third output signal, and
output, on the output line, the third output signal as a third pulse;
wherein the sampling by the first sampling circuit, the sampling by the second sampling circuit and the sampling by the third sampling circuit are time-interleaved; and
wherein the first pulses, the second pulses and the third pulses are time-interleaved.

15. The method of claim 10 wherein the first output signal and the second output signal are digital output signals indicative of the input voltage.

16. A method comprising:
performing repeatedly, by a first sampling circuit,
sampling an input voltage from the input terminal,
generating, from the input voltage, a first output signal, and
outputting, on an output line, the first output signal as a first pulse; and
performing repeatedly, by a second sampling circuit,
sampling an input voltage from the input terminal,
generating, from the input voltage, a second output signal, and
outputting, on the output line, the second output signal as a second pulse;
wherein the sampling by the first sampling circuit is time-interleaved with the sampling by the second sampling circuit;
wherein the first pulses are time-interleaved with the second pulses on the output line;
wherein the first output signal and the second output signal are digital output signals indicative of the input voltage; and
the method further comprising:
converting each of the digital output signals into an output analog voltage.

17. The method of claim 10 further comprising:
outputting a series of first sample-timing pulses interleaved with a series of second sample-timing pulses;
wherein each first sample-timing pulse activates the sampling by the first sampling circuit; and
wherein each second sample-timing pulse activates the sampling by the second sampling circuit.

18. A method comprising:
performing repeatedly, by a first sampling circuit,
sampling an input voltage from the input terminal,
generating, from the input voltage, a first output signal, and
outputting, on an output line, the first output signal as a first pulse; and
performing repeatedly, by a second sampling circuit,
sampling an input voltage from the input terminal, generating, from the input voltage, a second output signal, and outputting, on the output line, the second output signal as a second pulse;

wherein the sampling by the first sampling circuit is time-interleaved with the sampling by the second sampling circuit; and wherein the first pulses are time-interleaved with the second pulses on the output line; and the method further comprising:

outputting a series of first sample-timing pulses interleaved with a series of second sample-timing pulses, wherein each first sample-timing pulse activates the sampling by the first sampling circuit, and wherein each second sample-timing pulse activates the sampling by the second sampling circuit;

outputting a series of first output-timing pulses interleaved with a series of second output-timing pulses;

wherein the output-timing pulses are interleaved with the sample-timing pulses;

wherein the outputting by the first sampling circuit occurs during each first output-timing pulse; and wherein the outputting by the second sampling circuit occurs during each second output-timing pulse.

* * * * *